(12) United States Patent
Hsing Chen et al.

(10) Patent No.: US 7,582,915 B2
(45) Date of Patent: Sep. 1, 2009

(54) SIDE EMITTING LED

(75) Inventors: Chen-Lun Hsing Chen, Ping Chen (TW); Jung-Hao Hung, Ping Chen (TW)

(73) Assignee: Prolight Opto Technology Corporation, Ping Chen (TW)

( * ) Notice: Subject to any disclaimer, the term of this patent is extended or adjusted under 35 U.S.C. 154(b) by 281 days.

(21) Appl. No.: 11/695,197

(22) Filed: Apr. 2, 2007

(65) Prior Publication Data

US 2008/0128725 A1 Jun. 5, 2008

(30) Foreign Application Priority Data

Dec. 4, 2006 (TW) .............................. 95145058 A

(51) Int. Cl.
*H01L 33/00* (2006.01)
(52) U.S. Cl. ................................ 257/98; 257/E33.072
(58) Field of Classification Search ........... 257/98–100, 257/E33.072
See application file for complete search history.

(56) References Cited

U.S. PATENT DOCUMENTS

| 7,378,686 B2* | 5/2008 | Beeson et al. ................ 257/100 |
| 7,429,758 B2* | 9/2008 | Ruhnau et al. ................. 257/98 |
| 7,473,937 B2* | 1/2009 | Park et al. ..................... 257/98 |

* cited by examiner

*Primary Examiner*—Mark Prenty

(57) ABSTRACT

A side emitting LED is provided, and it includes a substrate, at least one LED chip, a light transmitting package and a light reflector. The substrate includes a base, and the LED chip is mounted on the base. The light transmitting package is a half-closed form and is mounted on the substrate to hold the LED chip. The light reflector is disposed on the package and corresponds to the LED chip to alter the light direction radiated from the LED chip. Therefore, the light radiated from the LED chip is reflected by the corresponding light reflector and passes through the light transmitting package to be emitted laterally.

11 Claims, 7 Drawing Sheets

SIDE EMITTING LED

RELATED APPLICATIONS

This application claims priority to Taiwan Application Serial Number 95145058, filed Dec. 4, 2006, which is herein incorporated by reference.

BACKGROUND

1. Field of Invention

The present invention relates to a light emitting diode, and more particularly to a side emitting light emitting diode with a light reflector for lateral emission.

2. Description of Related Art

Light emitting diodes have high reaction speeds, smaller volumes, lower power consumption, less heat radiation and extended lifetime such that conventional radiant or halogen lamps have gradually been replaced by light emitting diodes. In addition, the light emitting diode with a simple circuit design can be modulated in a small-scale and flat packaged. Thus, the light emitting diode back light module has substituted the conventional electro luminescence (EL) and cold cathode florescent lamp (CCFL) in the technology field. The light emitting diode application, like the indication light of the electronic apparatus, the back light source of the liquid crystal display (LCD) and the illuminator of the projector, are continually extended with the technological progress.

The back light module can be divided into two module kinds, side-edge backlight modules and direct type backlight modules, in accordance with the light source arrangement. Generally, the side-edge backlight module is applied to the display of portable computers and the direct type backlight modules applied to large scale LCD. The thinner module is the trend of the future technology. Therefore, the light emitting diode that occupies a smaller area is used to manufacture the thinner side-edge backlight module and the efficiency of the same area is enhanced.

Refer to FIG. 1. FIG. 1 illustrates a schematic view of the conventional sawtooth side emitting diode. The conventional sawtooth side emitting diode includes an additional sawtooth lens 900 attached with the structure to refract the emitting light laterally. Although this kind of light emitting diode can meet the requirements for side emitting light emitting diodes, the volume of the entire structure is too large to apply to small-scale modules. As a result, researchers aim at developing small volume side emitting diodes.

SUMMARY

It is therefore an object to provide a side emitting light emitting diode to offer a small volume side emitting light emitting diode which can be applied to small-scale modules.

It is therefore another object to provide a side emitting light emitting diode to abridge the scattering distance between the LED chip and the light reflector to enhance the light reflecting efficiency.

In accordance with the foregoing description and objectives, a side emitting light emitting diode is provided and it includes a substrate, at least one LED chip, a light transmitting package and a light reflector. The substrate has a base wherein the LED chip is mounted on the base. The light transmitting package is mounted on the substrate to hold the LED chip. The light reflector is mounted on the package and corresponds to the LED chip to alter the light direction scattered from the LED chip.

The light reflector is a half transmitting cone and the surface is anodized with an opaque and reflective layer made of the metal to reflect the light. The metal, such as the gold, silver, copper, tin, nickel or chrome, has high conductivity and reflectivity. In addition, the same reflective effect can also be achieved by changing the curvature of the light reflector surface. The light transmitting package includes a shell and a packaging gel. The packaging gel is epoxy or silicone resin and the refraction rate of the packaging gel is more than 1.35. The shell is made of light transmitting plastic with the refraction rate more than 1.3 and the transmittance more than 65%. The shell and the packaging gel can be made of the same material, such as the epoxy resin, silicone resin or polycarbonate. Therefore, the light emitted from the LED chip is reflected by the corresponding light reflector and passes through the packaging gel and the shell and is emitted laterally.

As a result, the side emitting light emitting diode of the present invention has the following effects:

1. In the present invention, the light reflector of the side emitting diode is mounted in the package. Compared with the conventional light emitting diode with an attached lens, the occupied area of the side emitting diode of the present invention is reduced such that the luminosity efficiency is enhanced in the same area.

2. In the present invention, the light reflector of the side emitting diode corresponds to the LED chip mounted on the base. Consequently, the light scattering distance is abridged to raise the side emitting effect.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
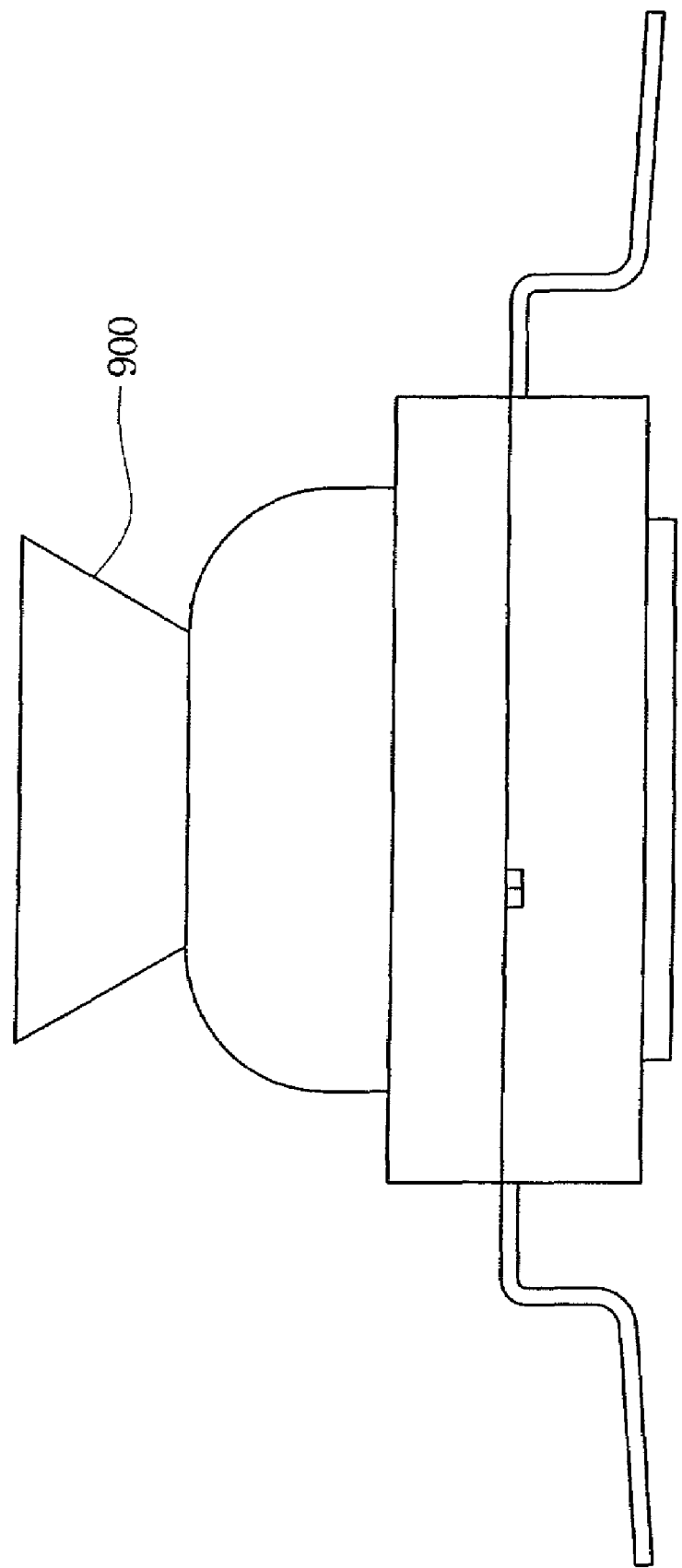
FIG. 1 is a schematic view of the sawtooth side emitting diode in accordance with the prior art.

Reference will now be made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention will be better understood from a consideration of the following description in conjunction with the figures, in which like reference numerals are carried forward.

Figure 2:
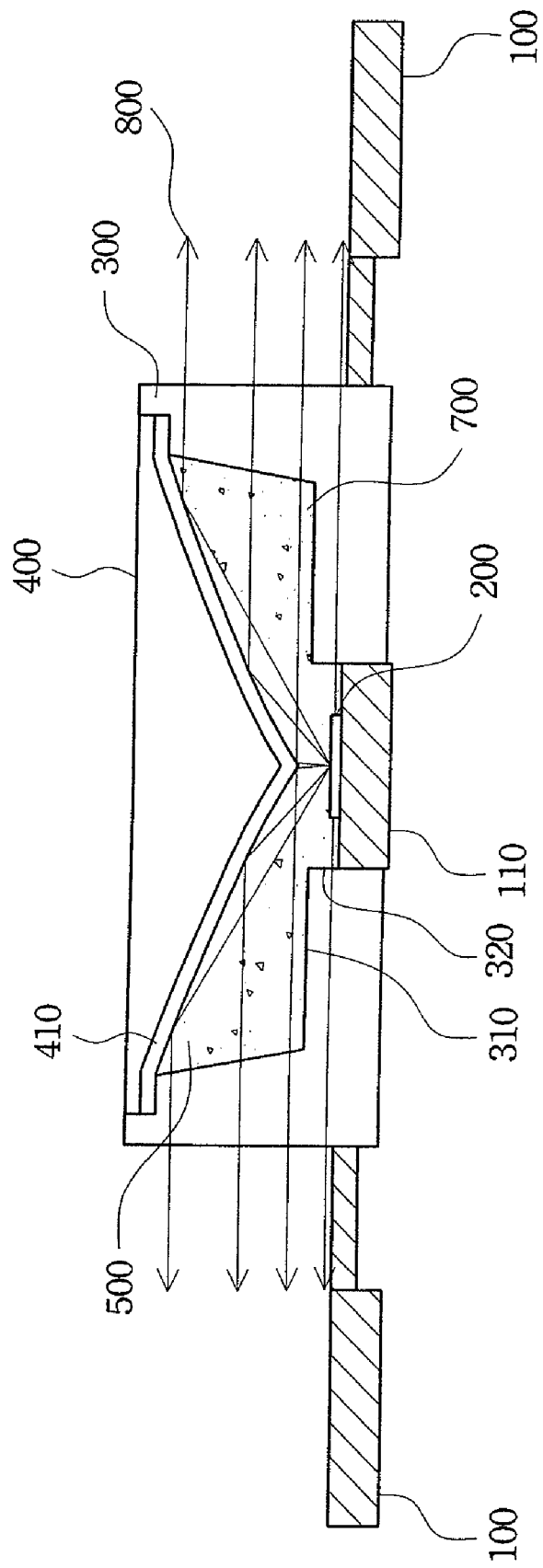
FIG. 2 is a sectional view of the side emitting diode in accordance with the first embodiment of the present invention.

Refer to FIG. 2. FIG. 2 illustrates a schematic view of the side emitting diode of the first embodiment. The side emitting diode includes a substrate 100, a LED chip 200, a shell 300, a light reflector 400 and a packaging gel 500. The shell 300 combines with the packaging gel 500 to form a light transmitting package holding the LED chip 200.

The substrate 100 is a lead frame and includes a base 110 wherein the LED chip 200 is mounted on the base 110. In the first embodiment, one LED chip 200 is used for illustration, but more than one LED chip 200 can used depending on the design requirements. The shell 300 is mounted on the substrate 100 and includes a space 700 wherein an opening 320 is defined in the bottom 310 of the space 700. The base 110 is fastened in the opening 320 such that the shell 300 is a half-closed structure. The shell 300 is made of light transmitting material. The light reflector 400 is secured in the shell 300 to enclose the space 700 to form a closed structure. The packaging gel 500 is filled with the space 700 between the shell 300 and the light reflector 400.

The light reflector 400 corresponds to the LED chip 200 and includes a surface 410. The surface 410 is a cone and a reflective layer is anodized on the surface 410. The reflective layer is made of the metal with high conductivity and reflectivity, such as the gold, silver, copper, tin, nickel or chrome. Through this opaque metal layer on the surface 410 of the light reflector 400, the light 800 emitted from the LED chip 200 is reflected laterally.

The packaging gel 500 is epoxy resin, silicone resin or polycarbonate and the refraction rate of the packaging gel 500 is more than 1.35. The shell 300 is made of light transmitting plastic, such as the epoxy, silicone resin, polycarbonate resin, polystyrene, acrylonitrile-styrene, methacrylic resin etc. The refraction rate of the shell 300 is more than 1.3 and the transmittance is more than 65%.

By means of the wire bonding manufacturing, the lead is connected with the LED chip 200 and the base 110 to drive the LED chip 200 to radiate. Thus, the light 800 emitted from the LED chip 200 is reflected by the corresponding metal layer of the light reflector 400 and passes through the packaging gel 500 in the space 700 and the shell 300 to be emitted laterally.

Figure 3:
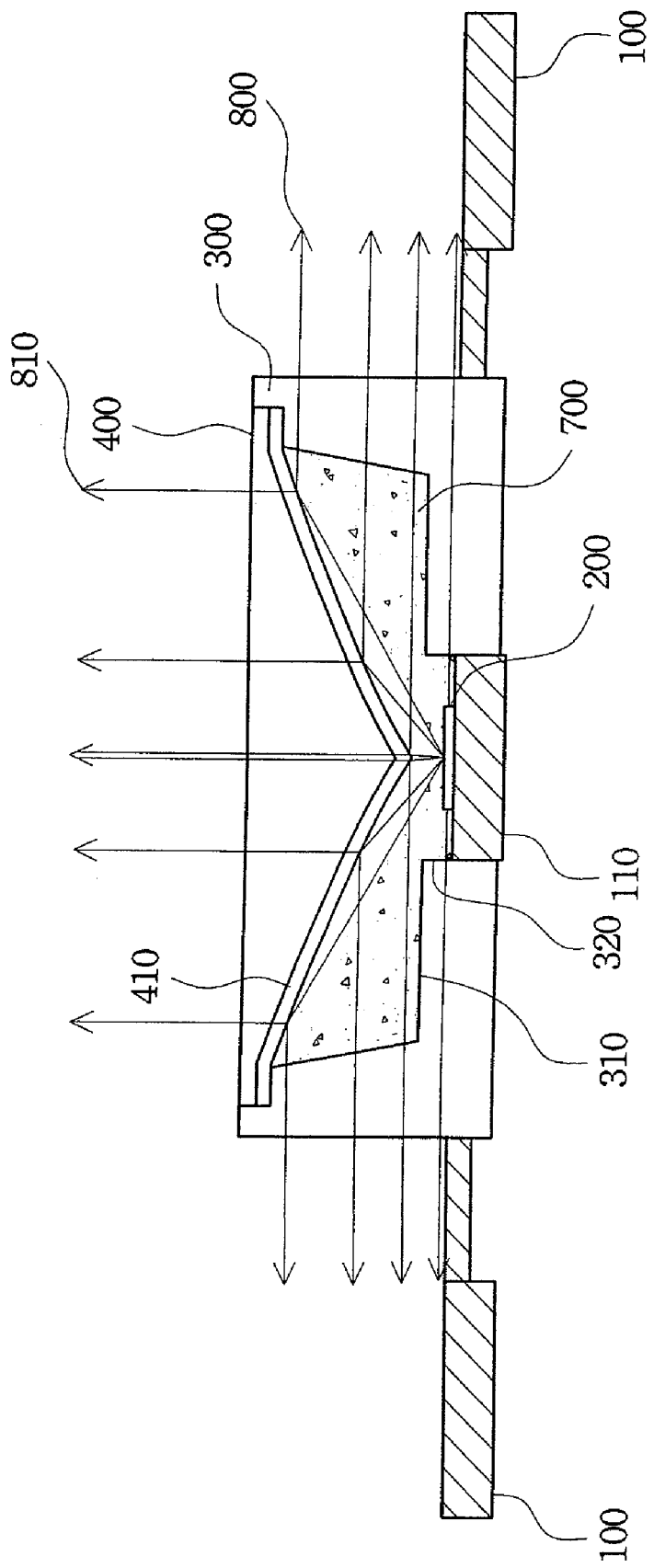
FIG. 3 is a sectional view of the side emitting diode in accordance with the second embodiment of the present invention.

Refer to FIG. 3. FIG. 3 illustrates a schematic view of the side emitting diode of the second embodiment. The difference between the first embodiment and the second embodiment is the light reflector 400 is half light transmitting i.e. translucent. In the second embodiment, the light 800 emitted from the LED chip 200 is substantially reflected laterally with the half light transmitting light reflector 400 and less light 810 is transmitted through the half light transmitting light reflector 400. Modifying the half light transmitting level of the light reflector 400 depends on the requirements of the luminosity ratio between the forward light and the lateral light. The other structure of the side emitting diode is the same as the one in the first embodiment, so there is no more detailed description herein.

Figure 4:
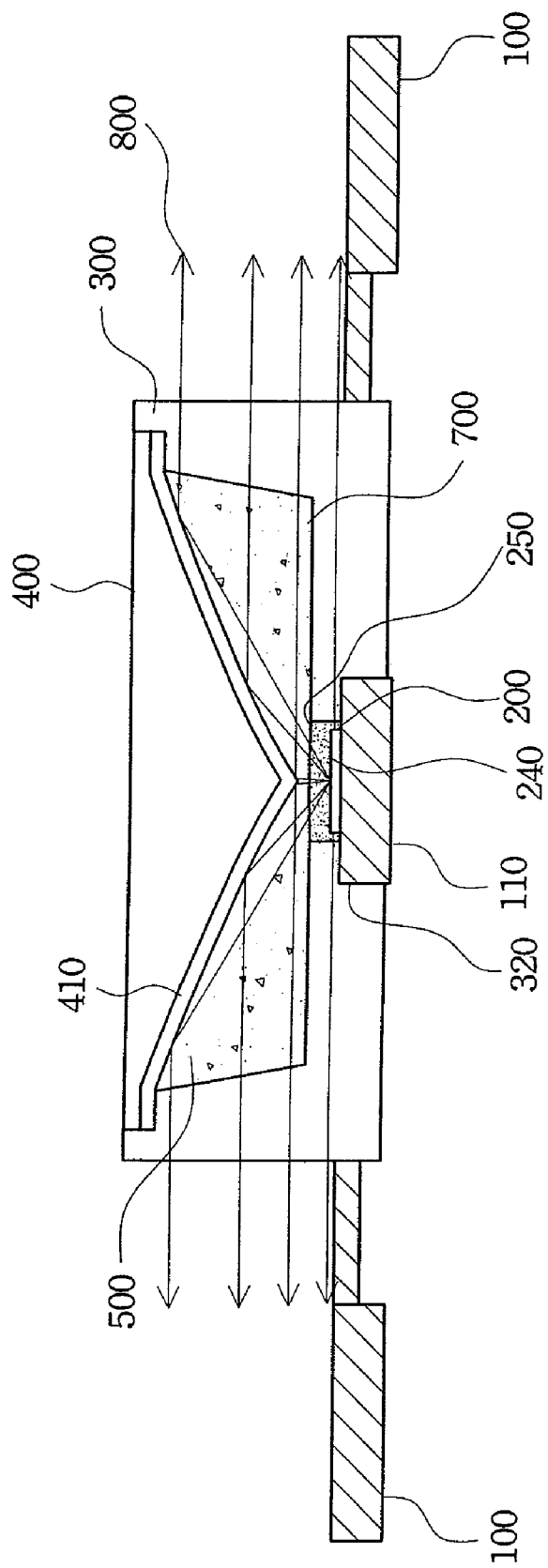
FIG. 4 is a sectional view of the side emitting diode in accordance with the third embodiment of the present invention.

Refer to FIG. 2 and FIG. 4. FIG. 4 illustrates a schematic view of the side emitting diode of the third embodiment. In the first embodiment, the side emitting diode can radiate white light by means of mixing the red light, blue light and green light respectively emitted from three LED chips 200 mounted on the base 110. In the third embodiment, the LED chip 200 emits blue light and is mounted on the base 110 where an attached layer 250 is added on the LED chip 200 wherein the attached layer 250 includes yellow phosphor 240. Through this method, the blue light emitted from the LED chip 200 is mixed with the yellow light excited from the yellow phosphor 240 to radiate white light. The other structure of the side emitting diode is the same as the one in the first embodiment, so there is no more detailed description herein.

Figure 5:
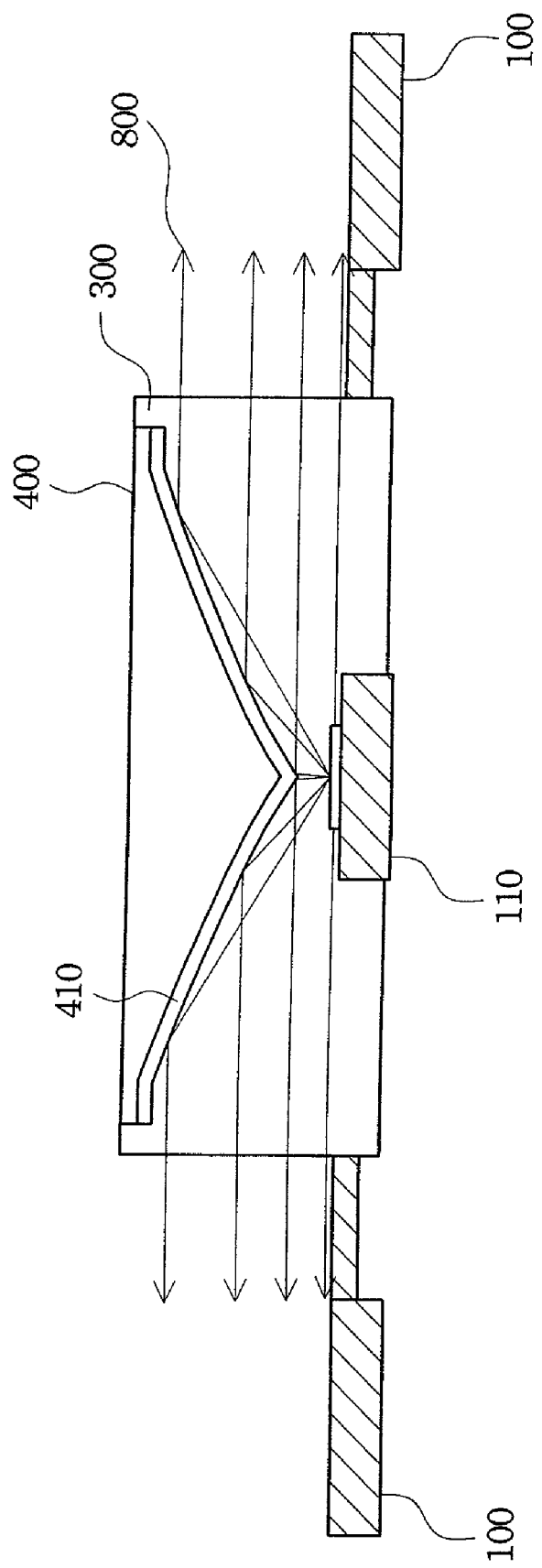
FIG. 5 is a sectional view of the side emitting diode in accordance with the fourth embodiment of the present invention.

Refer to FIG. 5. FIG. 5 illustrates a schematic view of the side emitting diode of the fourth embodiment. In the fourth embodiment, the shell 300 and the packaging gel 500 are fabricated as a whole and made of the same material to form a package. The material is epoxy resin or silicone resin with the refraction rate more than 1.3 and the transmittance more than 65%.

Figure 6:
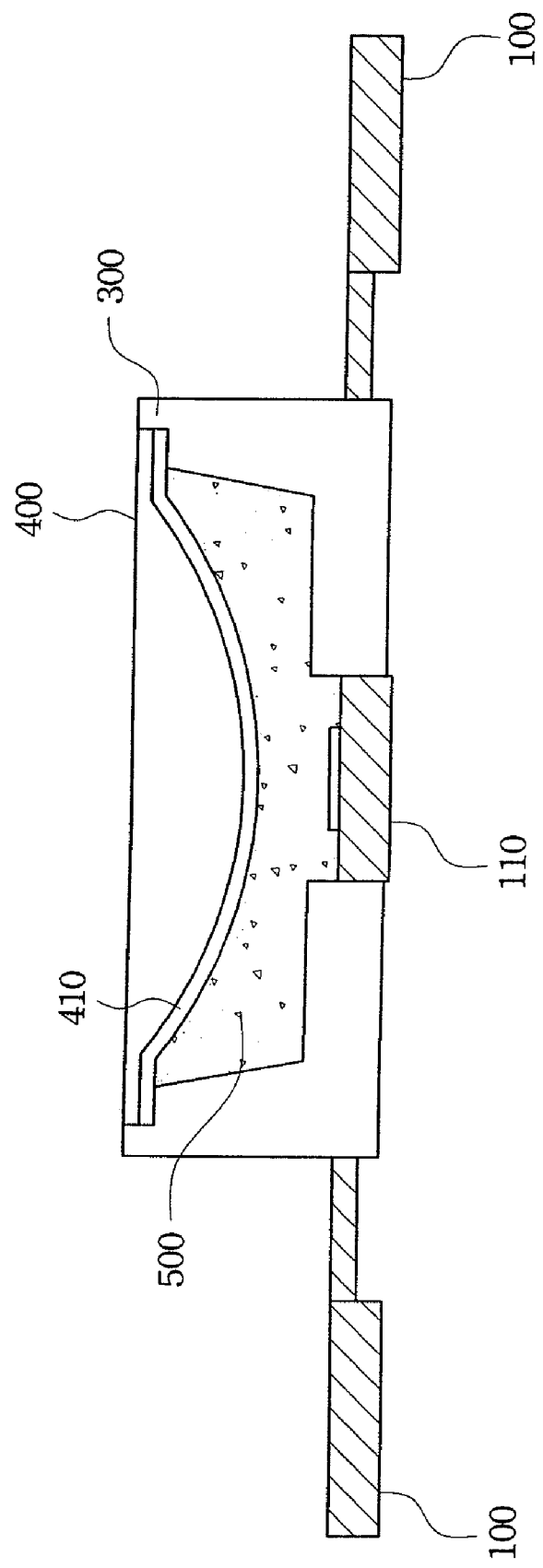
FIG. 6 is a sectional view of the side emitting diode in accordance with the fifth embodiment of the present invention.

Refer to FIG. 6. FIG. 6 illustrates a schematic view of the side emitting diode of the fifth embodiment. In the fifth embodiment, the light 800 is emitted laterally by means of changing the curvature of the light reflector 400 surface. The surface 410 of the light reflector 400 corresponding to the LED chip 200 is a curve made of light transmitting material. In addition, the light reflector 400 can be manufactured in the form of an opaque or translucent reflector depending on the design requirements, like anodizing a metal layer on the surface 410 in the first embodiment or altering the light reflector 400 into a translucent form in the second embodiment.

Figure 7:
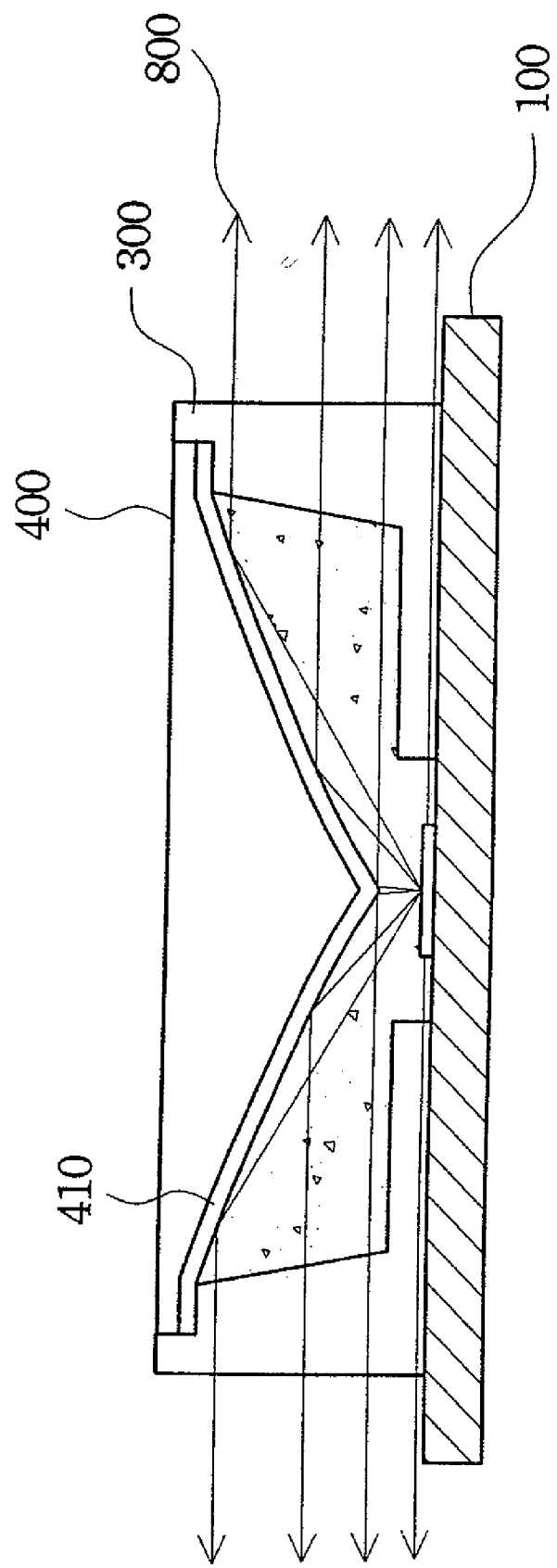
FIG. 7 is a sectional view of the side emitting diode in accordance with the sixth embodiment of the present invention.

Refer to FIG. 7. FIG. 7 illustrates a schematic view of the side emitting diode of the sixth embodiment. In the sixth embodiment, the side emitting diode is fabricated with flip-chip technology. The substrate 100 is changed into ceramic substrate, direct bonded copper (DBC) ceramic substrate, silicone substrate, PCB substrate, metal core (MC) PCB substrate or metal matrix composite (MMC) PCB substrate. The light reflector 400 in the sixth embodiment can be manufactured in an opaque form by anodizing a metal layer on the surface 410 in the first embodiment, half-light transmitting form by altering the light reflector 400 into a half-light transmitting reflector as in the second embodiment, or changing the surface curvature in the fifth embodiment to enable the side emitting effect.

As embodied and broadly described herein, the side light emitting diodes of these embodiments have the following effects:

1. In the present invention, the light reflector 400 of the side emitting diode is mounted in the package. Compared with the conventional light emitting diode with an attached lens, the occupied area of the side emitting diode of the present invention is reduced such that the luminosity efficiency is enhanced in the same area.

2. In the present invention, the light reflector 400 of the side emitting diode corresponds to the LED chip 200 mounted on the base 110. Consequently, the light scattering distance is abridged to raise the side emitting effect.

Although the present invention has been described in considerable detail with reference to certain preferred embodiments thereof, other embodiments are possible. Therefore, their spirit and scope of the appended claims should no be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A side emitting light emitting diode (LED), comprising:
   a substrate comprising a base;
   at least one LED chip mounted on the base;
   a light transmitting package fastened on the substrate to hold the at least one LED chip; and
   a light reflector secured on the light transmitting package and comprising a surface to alter a direction of light radiated from the at least one LED chip;
   wherein the surface of the light reflector is a conical surface, and the light reflector is opaque and the surface is anodized with a metal layer.

2. The side emitting LED of claim 1, wherein the metal layer is made of gold, silver, copper, tin, nickel or chrome.

3. A side emitting light emitting diode (LED), comprising:
   a substrate comprising a base;
   at least one LED chip mounted on the base;
   a light transmitting package fastened on the substrate to hold the at least one LED chip; and
   a light reflector secured on the light transmitting package and comprising a surface to alter a direction of light radiated from the at least one LED chip;
   wherein the surface of the light reflector is a conical surface, and the light reflector is a translucent reflector.

4. A side emitting light emitting diode (LED), comprising:
   a substrate comprising a base;
   at least one LED chip mounted on the base;
   a light transmitting package fastened on the substrate to hold the at least one LED chip; and
   a light reflector secured on the light transmitting package and comprising a surface to alter a direction of light radiated from the at least one LED chip;
   wherein the surface of the light reflector is a conical surface, and the light reflector is a light transmitting reflector.

5. A side emitting light emitting diode (LED), comprising:
   a substrate comprising a base;
   at least one LED chip mounted on the base;
   a light transmitting package fastened on the substrate to hold the at least one LED chip; and
   a light reflector secured on the light transmitting package and comprising a surface to alter a direction of light radiated from the at least one LED chip;
   wherein the light transmitting package comprises:
   a shell mounted on the substrate and comprising a space wherein the base is set in the space; and
   a packaging gel filling the space between the shell and the light reflector.

6. The side emitting LED of claim 5, wherein the packaging gel is epoxy resin, silicone resin or polycarbonate.

7. The side emitting LED of claim 5, wherein the shell is a light transmitting plastic.

8. The side emitting LED of claim 6, wherein the refraction rate of the packaging gel is more than 1.35.

9. The side emitting LED of claim 7, wherein the refraction rate of the shell is more than 1.3 and the transmittance is more than 65%.

10. The side emitting LED of claim 5, wherein the packaging gel and the shell are made of the same material.

11. The side emitting LED of claim 10, wherein the material of the packaging gel and the shell is epoxy resin, silicone resin or polycarbonate.

* * * * *